(12) United States Patent
Crespo et al.

(10) Patent No.: US 8,804,289 B2
(45) Date of Patent: Aug. 12, 2014

(54) VOLTAGE SURGE PROTECTION CIRCUIT

(75) Inventors: Denis Crespo, Amaye sure Orne (FR); Herve Marie, Ver sur Mer (FR); Nguyen Trieu Luan Le, Cormelles-le-Royal (FR); Mickael Lucas, Ifs (FR)

(73) Assignee: NXP, B.V., Eindhoven (NL)

(*) Notice: Subject to any disclaimer, the term of this patent is extended or adjusted under 35 U.S.C. 154(b) by 933 days.

(21) Appl. No.: 12/682,746

(22) PCT Filed: Oct. 13, 2008

(86) PCT No.: PCT/IB2008/054209
§ 371 (c)(1),
(2), (4) Date: Apr. 12, 2010

(87) PCT Pub. No.: WO2009/050641
PCT Pub. Date: Apr. 23, 2009

(65) Prior Publication Data
US 2010/0214706 A1 Aug. 26, 2010

(30) Foreign Application Priority Data
Oct. 17, 2007 (EP) .................................... 07118671

(51) Int. Cl.
H02H 9/04 (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 5,528,188 A | 6/1996 | Au et al. | |
| 5,530,612 A | 6/1996 | Maloney | |
| 5,631,793 A | 5/1997 | Ker et al. | |
| 5,654,862 A * | 8/1997 | Worley et al. | 361/111 |
| 5,708,549 A * | 1/1998 | Croft | 361/56 |
| 5,825,217 A * | 10/1998 | Lehavot | 327/111 |
| 5,903,419 A | 5/1999 | Smith | |
| 5,946,177 A | 8/1999 | Miller et al. | |
| 6,323,851 B1 * | 11/2001 | Nakanishi | 345/211 |
| 6,621,673 B2 | 9/2003 | Lin et al. | |
| 6,671,153 B1 | 12/2003 | Ker et al. | |
| 6,965,503 B2 * | 11/2005 | Connor et al. | 361/56 |
| 7,002,216 B2 | 2/2006 | Huang | |
| 7,092,227 B2 | 8/2006 | Ker et al. | |
| 2004/0109270 A1 | 6/2004 | Stockinger et al. | |
| 2005/0151200 A1 * | 7/2005 | Chen | 257/355 |
| 2006/0057814 A1 * | 3/2006 | Weis | 438/386 |
| 2007/0076338 A1 | 4/2007 | Traynor et al. | |

* cited by examiner

Primary Examiner — Jared Fureman
Assistant Examiner — Nicholas Ieva (57) ABSTRACT

A protection circuit (100, 700) is disclosed for protecting an integrated circuit having a first supply rail (Vcc) and a second supply rail (Vss) from exposure to an excessive voltage. The protection circuit (100, 700) comprises a sensor (120) for sensing a voltage increase on the first supply rail (Vcc). Such a sensor may be implemented as an RC element. The sensor (120) has an output coupled to a signal path for providing a detection signal on said path. The sensor (120) triggers a clamping circuit (180) to clamp the first supply rail (Vcc) to the second supply rail (Vss) in response to the detection signal, which typically signals an ESD event on the supply rails. A pre-amplifying stage (160) is coupled between the sensor (120) and the clamping circuit (180) to amplify the detection signal for the clamping circuit (180). The protection circuit further comprises a hold circuit (140) for holding the control input of the pre-amplifying stage (160) in an enabled state upon termination of the detection signal. Such a hold circuit may comprise a further RC element for accelerating the activation of the clamping circuit (180) and extending the activation of the clamping circuit beyond the termination of the detection signal, thus yielding a more efficient protection circuit (100, 700).

17 Claims, 6 Drawing Sheets

VOLTAGE SURGE PROTECTION CIRCUIT

The present invention relates to a protection circuit for protecting an integrated circuit having a first supply rail and a second supply rail from exposure to an excessive voltage, comprising a sensor for sensing a voltage increase on the first supply rail, the sensor having an output coupled to a signal path for providing a detection signal on said path; a clamping circuit for clamping the first supply rail to the second supply rail in response to the detection signal and a pre-amplifying stage having a control input coupled to the signal path and an output coupled to the clamping circuit.

The present invention further relates to an integrated circuit (IC) having such a circuit and to an electronic device having such an IC.

It is important to protect the components of an IC from exposure to excessive voltages, such as an electrostatic discharge (ESD) event, because exposure of the components to this excessive voltage may damage these components, for instance when the voltage exceeds the breakdown voltage of the component. To this end, many modern ICs comprise protection circuits that clamp a first supply rail of the IC, e.g. a supply voltage ($V_{DD}$) rail, to a second supply rail of the IC, e.g. ground, upon sensing a spike in the supply voltage. Such protection circuits may be located in the pad ring of the IC. It is important that such protection circuits are rapidly activated upon detection of such a spike to reduce the risk that the components of the IC are exposed to an excessive voltage.

An example of such a protection circuit is disclosed in U.S. Pat. No. 5,528,188. The protection circuit has a resistance capacitance (RC) circuit that senses an ESD transient on a pad of the IC. The RC circuit is coupled to a gate a FET for activating the FET in case of a detected ESD transient. A FET is used because of its relatively low threshold voltage ($V_{th}$), which means that the FET is switched on quickly upon the detection of the ESD transient. The FET acts as a trigger circuit for a rectifier implemented by means of bipolar NPN transistors. The rectifier absorbs the ESD energy on the pad, thus protecting the components of the IC from exposure to the ESD transient.

However, a drawback of such a protection circuit is that the RC time of the RC circuit may not be sufficient to effectively protect the IC components from exposure to a voltage increase. This problem is expected to become more prominent in future semiconductor technologies in which the component size is scaled down at a larger rate than the supply voltage of the predecessor technology.

The present invention seeks to provide a protection circuit that offers improved protection against excessive voltages on the pads of an IC.

The present invention further seeks to provide an IC comprising such a protection circuit and an electronic circuit comprising such an IC.

According to an aspect of the present invention, there is provided a protection circuit for protecting an integrated circuit having a first supply rail and a second supply rail from exposure to an excessive voltage, comprising a sensor for sensing a voltage increase on the first supply rail, the sensor having an output coupled to a signal path for providing a detection signal on said path; a clamping circuit for clamping the first supply rail to the second supply rail in response to the detection signal; a pre-amplifying stage having a control input coupled to the signal path and an output coupled to the clamping circuit; and a hold circuit for holding the control input of the pre-amplifying stage in an enabled state upon termination of the detection signal.

The hold circuit is arranged to keep sinking current through the sensor beyond the termination of an ESD event, thus ensuring that the clamping circuit is activated long enough for the protection circuit to be efficient, especially in situations where the excessive voltage slowly decreases to its nominal value, which could cause the prior art protection circuit to release the power supply too soon.

Preferably, the hold circuit comprises a switch coupled to the signal path for coupling the signal path to the second supply rail of the integrated circuit, the switch having a control terminal coupled to the output of the pre-amplifying stage via a capacitor. The capacitor of the hold circuit provides a current copy of the current generated by the sensor. This means that the pre-amplifying stage will be switched on more quickly, thus resulting the clamping circuit to clamp the first supply rail to a lower voltage than without the hold circuit.

Advantageously, the sensor comprises a capacitor for storing a voltage value of the first supply rail and an amplifier for amplifying the charge stored in the capacitor. Such a capacitance multiplier arrangement facilitates the use of a capacitor that requires a smaller area than the capacitor in the RC circuit of U.S. Pat. No. 5,528,188, which is an important advantage in technologies such as submicron technologies, where area reduction can significantly contribute to the cost reduction of the IC.

The pre-amplifier stage may be realized using stacked transistors, i.e. a first transistor and a second transistor arranged to be coupled in series between the first supply rail and the second supply rail to protect the transistors from breakdown when exposed to the excessive voltage. A voltage divider for dividing the voltage across the first supply rail and the second supply rail may be provided to bias the node between the stacked transistors. This further protects these transistors from exposure to an excessive voltage. The voltage divider may be implemented as a diode chain. This has the advantage of the protection circuit drawing a small static current. The static current may be further reduced by including a resistor between the second transistor of the transistor pair of the pre-amplifying stage and the second supply rail.

Preferably, the clamping circuit also comprises stacked transistors to give the clamping circuit improved robustness against an excessive voltage. For instance, the clamping circuit may comprise a first bipolar transistor having its collector arranged to be coupled to the first supply rail and its base coupled to the output of the voltage divider, and a second bipolar transistor being the second transistor of a Darlington stage, the first transistor of the Darlington stage being responsive to the output of the pre-amplifying stage, and wherein the clamping circuit further comprises a further transistor arranged to be coupled between the first supply rail and the base of the first bipolar transistor, said further transistor being responsive to the detection signal.

Alternatively, the clamping circuit may comprise a first MOS transistor having its gate coupled to the output of the voltage divider and a second MOS transistor being responsive to the output of the pre-amplifying stage, and wherein the clamping circuit further comprises a further transistor arranged to be coupled between the first supply rail and the gate of the first MOS transistor, the further transistor being responsive to the detection signal.

According to another aspect of the present invention there is provided an IC having a first supply rail, a second supply rail and a protection circuit of the present invention coupled between the first supply rail and the second supply rail.

According to yet another aspect of the present invention there is provided an electronic device comprising an IC of the present invention, in which the electronic device comprises a power supply coupled to the first supply rail and the second supply rail of the IC. Such an IC and electronic device benefit from improved robustness against voltage surges from ESD events due to the inclusion of a protection circuit of the present invention.

The invention is described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

Figure 1:
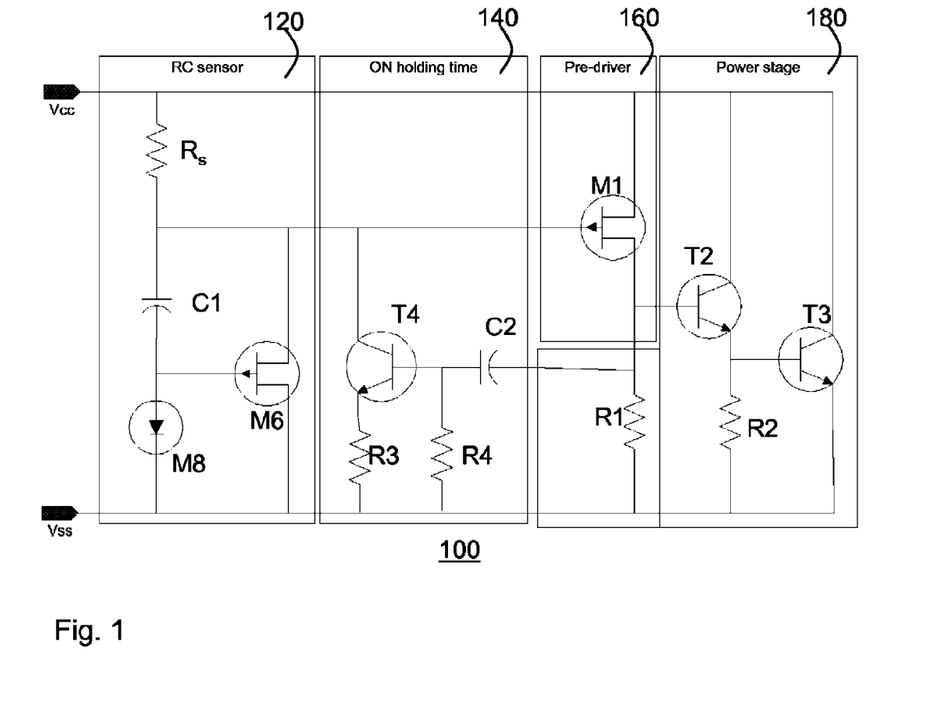
FIG. 1 shows a first embodiment of a protection circuit of the present invention.

FIG. 1 shows a part of an IC of the present invention, and in particular a first example of a protection circuit 100 of the present invention. The protection circuit 100 is coupled between a first supply rail Vcc and a second supply rail Vss to absorb any supply surges on these supply rails, such as surges caused by the occurrence of an ESD event. Consequently, other parts of the IC that are coupled between these supply rails are protected from exposure to these surges.

To this end, the protection circuit 100 comprises a sensor 120 arranged to detect a voltage increase on the first supply rail Vcc. The sensor 120 may be implemented in any known way, however, a preferred embodiment is shown in FIG. 1, in which the sensor 120 comprises a resistor $R_s$ coupled in series with a capacitor C1. The current generated by the capacitor C1 as a result of a change in voltage on the first supply rail Vss is used as a detection signal of the voltage change. The RC stage formed by the resistor $R_s$ and capacitor C1 may be coupled to the second supply rail Vss via a diode element, such as a diode coupled transistor M8. This facilitates the implementation of the capacitor C1 as a capacitance multiplier using an amplifier M6, which may be implemented as a switch such as a MOS transistor.

In this arrangement, the amplifier M6 forms a current mirror with the diode M8. This has the advantage that the storage capacity of the capacitor may be reduced, because the current generated by the capacitor C1 is amplified by the amplifier M6. Consequently, a less dense capacitor such as a poly capacitor may be used, thus obviating the need for a high density capacitor, which may not be available in every technology, and may not be suitable for high voltage applications. For instance, a high density metal-insulator-metal (MIM) capacitor is not suitable for use in applications exposed to voltage surges up to 7V, whereas a poly-Si capacitor may be used in such applications. The use of a poly capacitor C1 in combination with an amplifier M6 realizes a significant area reduction compared to a MIM capacitor in isolation. For instance, in present semiconductor technologies, the amplifier M6 may be realized in an area of around 100 $\mu m^2$, and a poly-Si based capacitor may be realized in an area of around 250 $\mu m^2$, compared to the required area for a MIM capacitor of around $2*10^3$ $\mu m^2$.

The protection circuit 100 further comprises a pre-amplifying stage 160 for amplifying this detection signal. The pre-amplifying stage 160 comprises an amplifier M1 for this purpose. The amplifier M1 may be implemented as a switch such as a MOS transistor, which can switch on quickly due to its relatively low $V_{th}$. The output of the pre-amplifying stage 160 is coupled to a clamping circuit 180 arranged to clamp the first supply rail Vcc to the second supply rail Vss in case of an ESD event signaled by the detection signal from the sensor 120. Such a clamping circuit 180 is typically designed to short the first and second supply rails with a low impedance; a typical on-resistance of the clamping circuit 180 is 1Ω.

Figure 2:
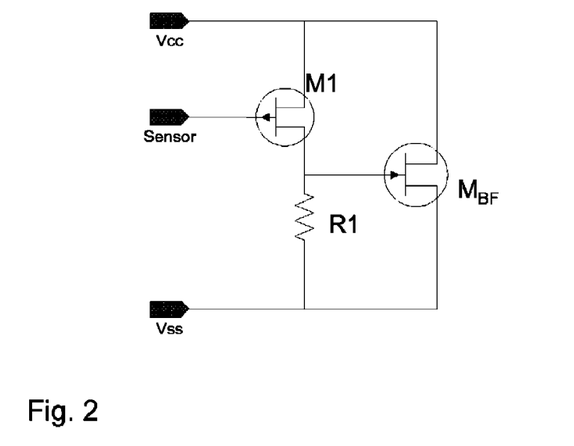
FIG. 2 shows an aspect of a second embodiment of a protection circuit of the present invention.

In FIG. 1, the clamping circuit 180 is implemented as a Darlington stage comprising a pair of NPN transistors T2 and T3. In order to improve the breakdown voltage of these transistors, a resistance between the base and emitter may be included in their design. An alternative embodiment of the clamping circuit 180 is shown in FIG. 2, in which the bipolar Darlington stage is replaced by a large FET $M_{BF}$. Such a field effect transistor must be dimensioned appropriately to ensure that its breakdown voltage is high enough to withstand the voltage surges of potential ESD events.

Now, returning to FIG. 1, the protection circuit 100 further comprises a hold circuit 140 arranged between the sensor 120 and the pre-amplifying stage 160. The purpose of the hold circuit 140 is two-fold; it should accelerate the activation of the clamping circuit 180 as well as extend the activation period of the clamping circuit 180 beyond the termination of the detection signal. A possible implementation is shown in FIG. 1, in which the hold circuit 140 comprises an RC element implemented by capacitor C2 and resistor R4 coupled to the control terminal of a switch T4 that is coupled between the conductive path from the sensor 120 to the pre-amplifying stage 140 and the second supply rail Vss.

Preferably, the switch T4 should have a higher $V_{th}$ than amplifying switch M1 to ensure that the switch M1 remains switched on when switch T4 is switched on. This may be realized by implementing M1 as a MOS transistor and T4 as a bipolar transistor. However, it should be appreciated that it will be obvious to the skilled person that alternative implementations of the hold circuit 140 are also feasible. Resistors R1-R3 have been added to reduce the static current consumed by the protection circuit 100. It will be appreciated that the inclusion of these resistors is optional, and not required for the correct operation of the protection circuit 100.

Figure 3:
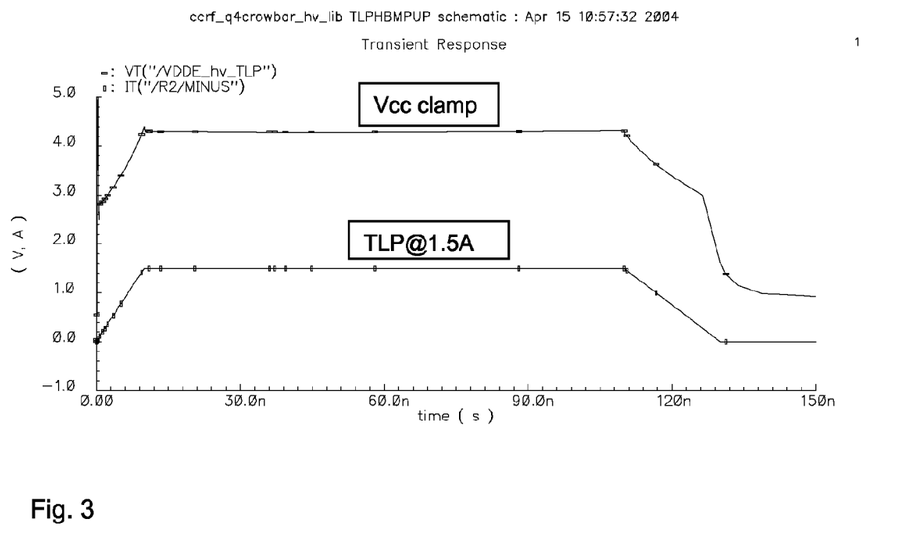
FIG. 3 shows the results of a transmission line pulse simulation applied to the protection circuit of FIG. 1.
Figure 4:
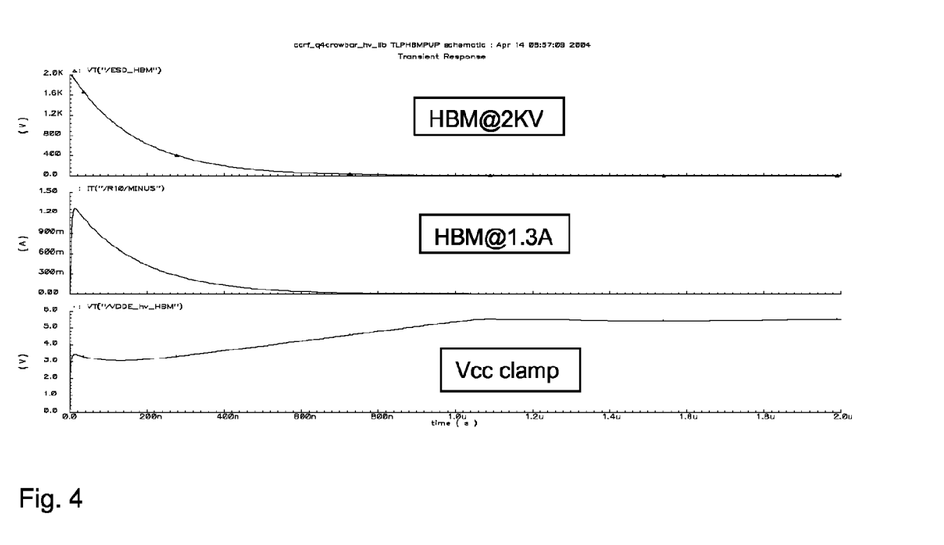
FIG. 4 shows the results of a human body model simulation applied to the protection circuit of FIG. 1.
Figure 5:
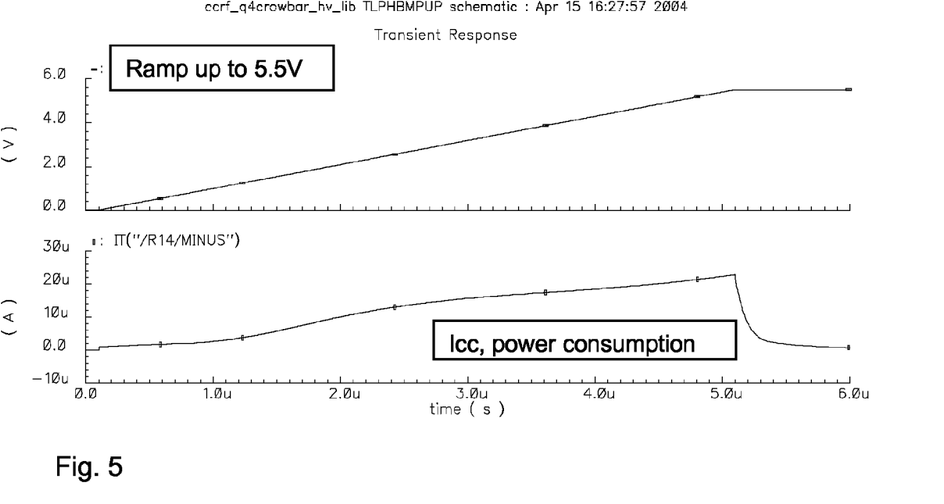
FIG. 5 shows the results of a power supply ramp up simulation applied to the protection circuit of FIG. 1.

FIGS. 3-5 show simulation results of the behavior of protection circuit 100 comprising a Darlington stage based clamping circuit 180. The upper curve in FIG. 3 shows the result of a transition line pulse test simulation at 1.5 A. As can be seen, the protection circuit 100 (transient Vcc clamp) is activated upon the detection of the rising edge of the transition pulse (transient TLP@1.5 A). The protection 100 effectively sinks the current through the clamping circuit 180 during the steady phase of the transition pulse, i.e. when the pulse is at its maximum value, and the protection circuit 100 switches off again around t=120 ns in response to the disappearance of the pulse on Vcc.

FIG. 4 shows the result of a human body model test simulation at 2 kV. It is again demonstrated that the protection circuit 100 is activated (Vcc clamp) during the human body model event (transients HBM@2 kV and HBM@1.3 A). Importantly, it is demonstrated that upon detection of the human body model event, the protection circuit 100 clamps the power supply rails to a value below the full power supply, i.e. below 5.5V in this example.

FIG. 5 shows the power consumption of the protection circuit 100 during a ramp-up of the supply voltage to 5.5 V at 300 K. From FIG. 5, it is clear that the power consumption of the protection circuit 100 does not significantly increase during supply ramp-up, thus providing evidence of the fact that the protection circuit 100 of the present invention is capable of distinguishing between a normal power-supply ramp-up and a hazardous voltage surge on the supply rail Vcc. Table I shows the leakage currents of the protection circuit 100 at various temperatures compared against a specification requirement for such a circuit.

TABLE I

|  | ESD power supply clamp | Specification |
| --- | --- | --- |
| Max Voltage | 5.5 V | |
| $I_{leak1}$ @ 25° C. | 264 pA | 10 nA |
| $I_{leak2}$ @ 100° C. | 6.6 nA | 1 uA |
| $I_{leak3}$ @ 140° C. | 22 nA | 10 uA |

It is clear from Table I that the protection circuit 100 performs well within the requirements for such a circuit; the actual leakage current is several orders of magnitude smaller than required.

Figure 6:
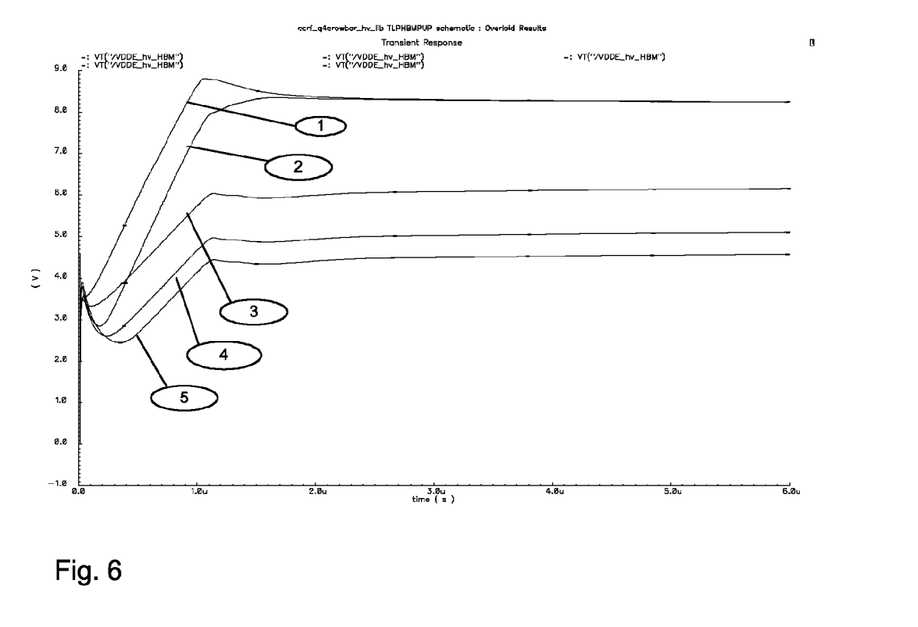
FIG. 6 shows a comparison between the behavior of the protection circuit of FIG. 1 and a prior art protection circuit.

FIG. 6 shows a comparison between the protection circuit 100 and a protection circuit without a hold circuit. The configuration of the protection circuits corresponding to the various transients 1-5 is summarized in Table II.

TABLE II

| | RC constants sensor 120 | | RC constants hold circuit 140 | | $V_{cc}$ clamping circuit |
| --- | --- | --- | --- | --- | --- |
| Transient | $R_s$ (KΩ) | $C_1$ (pF) | $R_4$ (KΩ) | $C_2$ (pF) | 180 (V) |
| 1 | 150 | 2 | Without | Without | 8.2 |
| 2 | 150 | 2 | 150 | 2 | 8.2 |
| 3 | 300 | 2 | Without | Without | 6 |
| 4 | 300 | 2 | 150 | 2 | 5 |
| 5 | 300 | 2 | 150 | 4 | 4.5 |

It can be seen from FIG. 6 that immediately after t=0 μs, the transients of the various configurations of the protection circuit 100, i.e. the circuits including a hold circuit 140 (transients 2, 4 and 5) show a voltage increase from 0V to around 4V. This increase is caused by the response time of the clamping circuit 180 to the detection signal. The effect of the presence of a hold circuit 140 becomes apparent immediately after this voltage increase; up to about 0.4 μs, the voltage of transients 2, 4 and 5 decreases; an effect that cannot be observed for transients 1 and 3, i.e. in protection circuits lacking such a hold circuit 140. The hold circuit 140 causes the clamping circuit 180 to drive more current than is provided by the ESD event, thus resulting in a quicker activation of the protection circuit 100, and hence a more effective protection against ESD. The transients 1-5 from t=0.4 μs onwards show an increase in all voltages increased until the power supply clamping value of the clamping circuit 180 is reached.

A particular advantageous effect of the inclusion of the hold circuit 140 can be observed in transients 4 and 5; because the RC constants of the sensor 120 and the hold circuit 140 can be chosen independently, the protection circuit can be more effectively tuned to clamp the power supply to a particular value. For instance, in the example embodiment of the protection circuit 100 used in the above simulations, the maximum allowable clamping voltage was set to 5.5 V. Transients 4 and 5 achieve a clamping voltage well below this value. It will be appreciated that it is not trivial to tune an RC element to such a value because the chosen RC value must ensure that a protection circuit does not activate itself upon normal power-up of the IC, whereas it should respond quickly enough to voltage spikes to prevent the IC from becoming exposed to such spikes. It has been found that the presence of the RC element in the hold circuit 140 improves the design flexibility of the protection circuit 100 to clamp the power supply to a predefined value compared to protection circuits that have a single RC element in the sensor 120.

Figure 7:
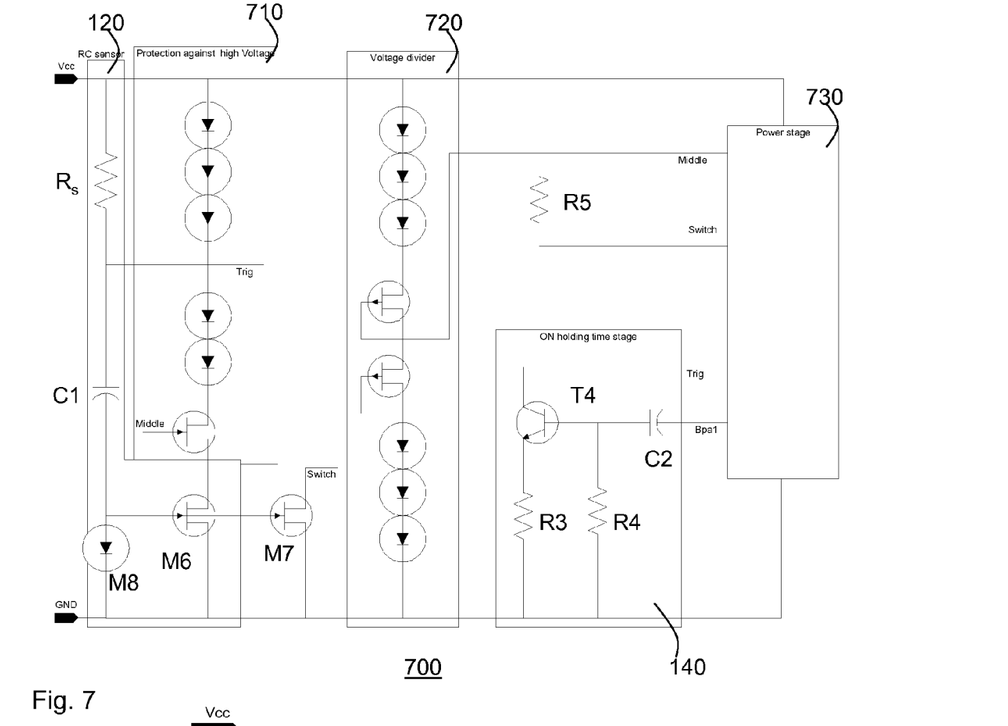
FIG. 7 shows a third embodiment of a protection circuit of the present invention.

It may also be necessary to protect the components of the protection circuit 100 from becoming exposed to the spikes in the power supply. This particularly holds for those components that have a breakdown voltage that is lower than the potential maximum value of such a voltage surge. An embodiment of a protection circuit 700 that is more robust against exposure to such surges is shown in FIG. 7. In addition to the circuit portions already discussed for protection circuit 100, the circuit protection circuit 700 further comprises a voltage follower 710 and a voltage divider 720 for dividing the voltage on the first supply rail Vcc to e.g. Vcc/2. The voltage follower 710 protects the switch M6 from exposure to an excessive voltage by providing the node Trig with reduced voltage. In the example given in FIG. 7, the three diodes between supply rail Vss and the node Trig may be implemented as three series connected bipolar transistors, such that the voltage on the node Trig becomes Vss−3Vbe. Obviously, other implementations using different numbers of diodes and different diode implementations are also feasible. The voltage divider 720 provides a bias voltage for a power stage 730 including embodiments of the pre-amplifying stage 160 and the clamping circuit 180. The voltage follower 710 and the voltage divider 720 have been implemented as diode chains because of the limited size of such a chain; however, other known implementations of such voltage reducing elements may also be used. In general, the use of the voltage divider 720 obviates the need for using more complex biasing circuitry, thus reducing the area of the protection circuit 700.

Figure 8:
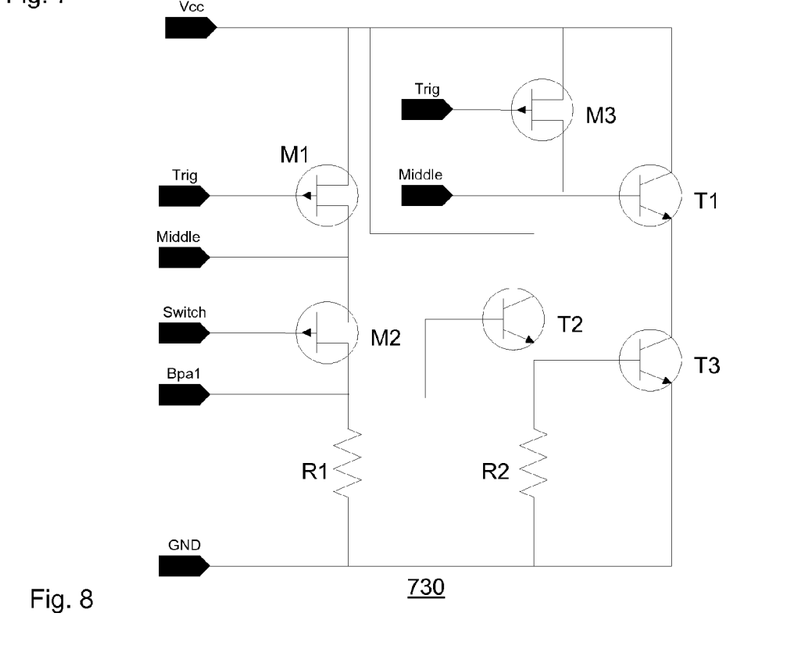
FIG. 8 shows an aspect of the third embodiment of a protection circuit of the present invention in more detail.

FIG. 8 shows the power stage 730 in more detail. The pre-amplifying stage 140 is implemented by means of two amplifiers M1 and M2 coupled in series between the first power supply rail Vcc and the second supply rail GND. In the present application, the labels Vss and GND have been merely used as interchangeable alternatives; these labels do not imply a reference to different supply rails. The amplifiers M1 and M2 may be implemented as transistors such as MOS transistors. The node between the two amplifiers M1 and M2 is biased by the output Middle of the voltage divider 720 such that each individual amplifier is subjected to a voltage of Vcc/2 rather than Vcc. Consequently, by implementing the pre-amplifying stage 140 using multiple series connected devices and provided a bias voltage at its intermediate nodes, devices can be used that have a lower breakdown voltage than the potential maximum voltage of a voltage spike. For instance, in case of M1 and M2 being MOS transistors having a breakdown voltage of 2.5 V, the protection circuit 700 can handle voltage spikes up to 5 V. This obviates the need to increase the size of the devise M1 and M2 to increase their breakdown voltage.

The pre-amplifying stage of FIG. 8 may be susceptible to non-negligible static leakage currents through one of its devices M1, M2 in case a residual current runs through the voltage divider 720. This may be avoided by the introduction of resistor R5, which causes the grid of the devices M1 and M2 to be shorted with the output Middle of the voltage divider 720, thus effectively switching off the pre-amplifying stage in such a static mode.

In order to ensure that the pre-amplifying stage is appropriately switched on during an ESD event, the control terminal of amplifier M1 is responsive to the detection signal generated by the sensor 120, and the control terminal of amplifier M1 is coupled to the second supply rail GND via a switch M7. The switch M7, which may be implemented as a transistor such as a MOS transistor, has its control terminal coupled to a node between capacitor C1 and the second supply rail Vss. The switch M7 pulls down the grid of the of the protection circuit 100 together with the capacitor C1 of the sensor 120, thus effectively turning on the amplifier M2.

Similarly, the clamping circuit 180 may be implemented using series connected devices to protect these devices from exposure to a voltage in excess of their breakdown voltage. In FIG. 8, the clamping circuit 180 comprises the Darlington stage implemented by bipolar transistors T2 and T3. Transistor T3 is coupled in series with a cascaded bipolar transistor T1, which has its base connected to the output Middle of the voltage divider 720. Due to its cascaded structure, bipolar transistor T1 is capable of withstanding high voltages, i.e. voltages in excess of the breakdown voltage of transistor T3.

However, a potential drawback of such a cascaded device is that it may have a relatively high resistance, which would cause the device to drop down when the common emitter transistor T3 of the Darlington stage is switched on. This could reduce the clamping efficiency of the clamping circuit. To this end, a switch M3, which may be a MOS transistor, may be coupled between the first supply rail Vcc and the base of the cascaded bipolar transistor T1, with the switch M3 being responsive to the detection signal. The switch M3 thus pulls up the cascaded bipolar transistor T1 during an ESD event such that the current consumption characteristics of the clamping circuit are not adversely affected. Alternatively, switch M3 may be omitted and the node between the pre-amplifier devices M1 and M2 may be shorted with the base of the cascaded bipolar transistor T1. In this case, the size of the amplifier devices M1 and M2 must be adjusted to obtain a higher current drive for the cascaded bipolar transistor T1.

In case the Darlington stage formed by bipolar transistors T2 and T3 has a breakdown voltage that is insufficient to withstand the voltage spikes on the first supply rail Vcc, the transistors T2 and/or T3 may include a resistance between base and emitter to increase the breakdown voltage of the bipolar transistors from $BV_{CEO}$ (the breakdown voltage between collector and emitter with an open source base) to $BV_{CER}$ (the breakdown voltage between collector and emitter with a resistive open source base).

Figure 9:
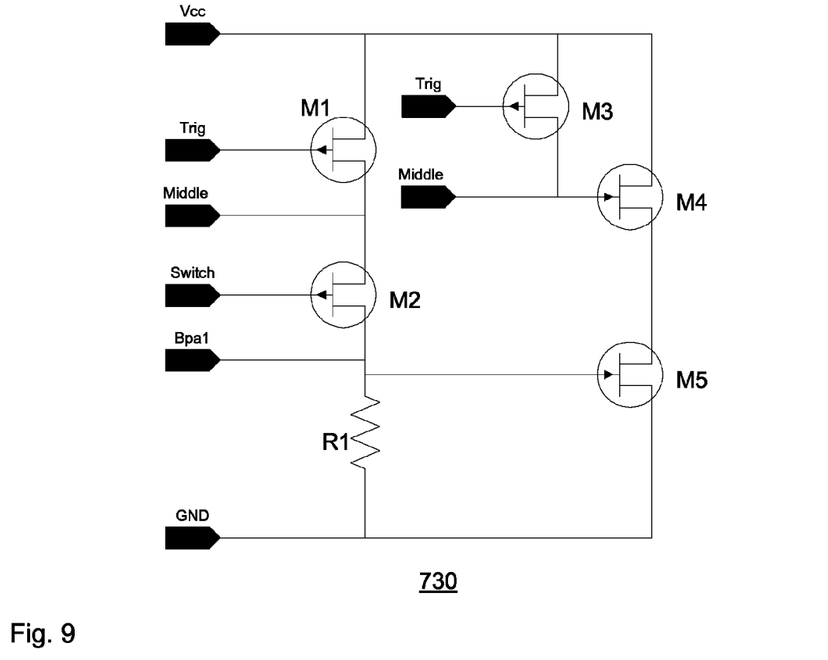
FIG. 9 shows an aspect of a fourth embodiment of a protection circuit of the present invention.

The clamping circuit 180 may also be implemented using cascaded MOS transistors, as shown in FIG. 9. Here, MOS transistors M4 and M5 are connected in series between the first supply rail Vcc and the second supply rail GND. The gate of MOS transistor M4 is coupled to the output of the voltage divider 720, and the gate of MOS transistor M5 is coupled to the output of the pre-amplifying stage implemented by series connected MOS transistors M1 and M2. The switch M3 may be included to pull up the MOS transistor M4 during an ESD event in case this transistor has a relatively high resistance, as already discussed for the bipolar transistor T1 of FIG. 8. The MOS transistors M3 and M4 should be dimensioned appropriately such that these transistors can withstand the voltage spikes on the first supply rail Vcc.

Figure 10:
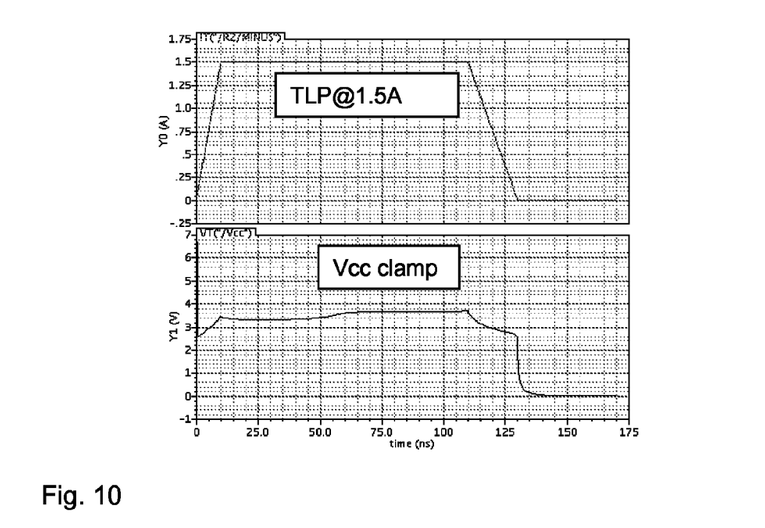
FIG. 10 shows the results of a transmission line pulse simulation applied to the protection circuit of FIG. 7.
Figure 11:
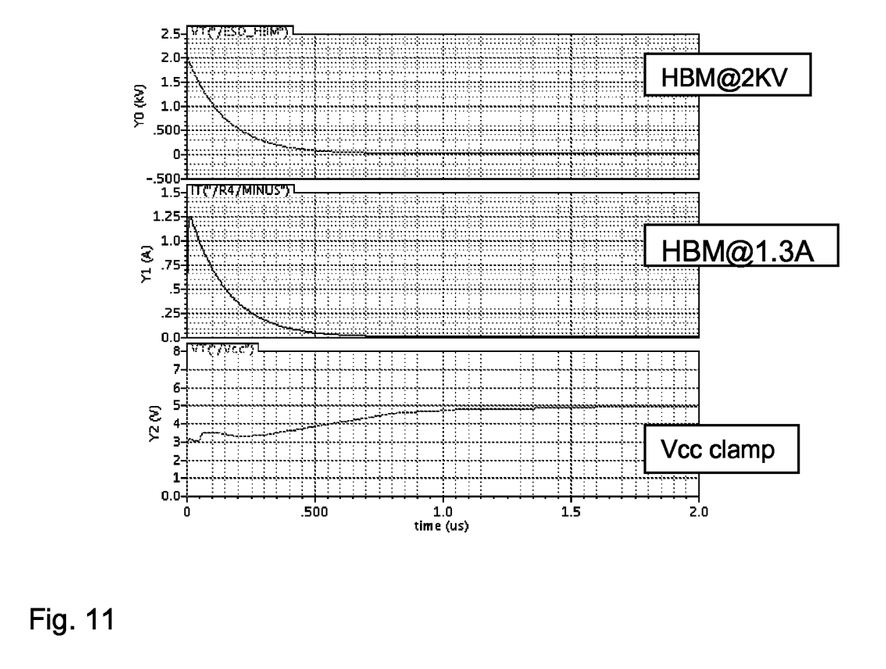
FIG. 11 shows the results of a human body model simulation applied to the protection circuit of FIG. 7.
Figure 12:
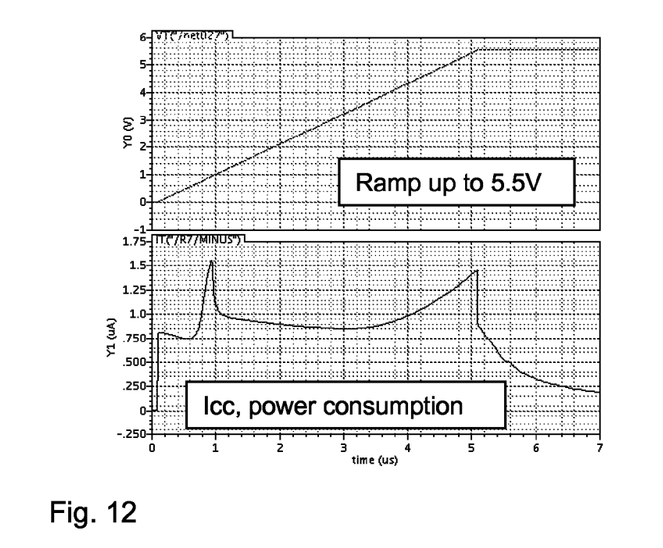
FIG. 12 shows the results of a power supply ramp up simulation applied to the protection circuit of FIG. 7.

FIGS. 10-12 show simulation results of the behavior of the protection circuit 700 having a Darlington stage based clamping circuit. The upper curve in FIG. 10 shows the result of a transition line pulse test simulation at 1.5 A. As can be seen, the protection circuit 700 (transient Vcc clamp) is activated upon the detection of the rising edge of the transition pulse (transient TLP@1.5 A). The protection circuit 700 effectively sinks the current through the clamping circuit 180 during the steady phase of the transition pulse, i.e. when the pulse is at its maximum value, and the protection circuit 700 switches off again around t=120 ns in response to the disappearance of the pulse on the supply rail Vcc, again demonstrating that the protection circuit of the present invention exhibits the desired behavior upon occurrence of a voltage spike of the supply rail Vcc.

FIG. 11 shows the result of a human body model test simulation at 2 kV. It is again demonstrated that the protection circuit 700 is activated (transient Vcc clamp) during the human body model event (transients HBM@2 kV and HBM@1.3 A). Importantly, it is demonstrated that upon detection of the human body model event, the protection circuit 700 clamps the power supply rails to a value below the full power supply, i.e. below 5.5V in this example.

FIG. 12 shows the power consumption of the protection circuit 700 during a ramp-up of the supply voltage to 5.5 V at 300 K. From FIG. 12, it is clear that the power consumption of the protection circuit 700 does not significantly increase during supply ramp-up, thus providing evidence of the fact that the protection circuit 700 of the present invention is capable of distinguishing between a normal power-supply ramp-up and a hazardous voltage surge on the supply rail Vcc. Table III shows the leakage currents of the protection circuit 700 at various temperatures and for various process corners (i.e. low, nominal and high corner) compared against a specification requirement for such a circuit.

TABLE III

| T (K) | | 300 | |
|---|---|---|---|
| Process | Low | Nominal | High |
| I leak | 282 pA | 360 pA | 468 pA |
| Specification | | 10 nA | |
| (K) | | 373 | |
| Process | Low | Nominal | High |
| I leak | 9 nA | 12 nA | 16 nA |
| Specification | | 1 µA | |
| T (K) | | 413 | |
| Process | Low | Nominal | High |
| I leak | 28 nA | 37 nA | 49 nA |
| Specification | | 1.5 µA | |

It is clear from Table I that the protection circuit 700 performs well within the requirements for such a circuit; the actual leakage current is several orders of magnitude smaller than required.

The protection circuits of the present invention may be incorporated in ICs by placing the protection circuits between the first supply rail Vcc and the second supply rail Vss of such an IC. This protects other IC components that are coupled between the first supply rail Vcc and the second supply rail Vss from damage caused by exposure to excessive voltages. Such an IC may be advantageously incorporated in an electronic device with a power supply coupled to the first supply rail Vcc and the second supply rail Vss of the IC, because it relaxes the design requirements for such a power supply. The power supply may be a rechargeable power supply, e.g. a battery pack.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A protection circuit for protecting an integrated circuit having a first supply rail and a second supply rail from exposure to an excessive voltage, comprising:
   a sensor for sensing a voltage increase on the first supply rail, the sensor having an output coupled to a signal path for providing a detection signal on said path;
   a clamping circuit for clamping the first supply rail to the second supply rail in response to the detection signal;
   a pre-amplifying stage having a control input coupled to the signal path and an output coupled to the clamping circuit; and
   a hold circuit for holding the control input of the pre-amplifying stage in an enabled state upon termination of the detection signal;
   wherein the sensor comprises a poly-Si based capacitor for storing a voltage value of the first supply rail, an amplifier for amplifying the charge stored in the poly-Si based capacitor, and a diode connected between the capacitor and the second supply rail, wherein the amplifier forms a current mirror with the diode.

2. A protection circuit as claimed in claim 1, wherein the hold circuit comprises a switch coupled to the signal path for coupling the signal path to the second supply rail of the integrated circuit, the switch having a control terminal coupled to the output of the pre-amplifying stage via a capacitor.

3. A protection circuit as claimed in claim 1, further comprising a voltage follower, and wherein the amplifier comprises a pair of transistors arranged to be coupled in series between the first supply rail via the voltage follower and the second supply rail respectively.

4. A protection circuit as claimed in claim 1, further comprising a voltage divider for dividing the voltage across the first supply rail and the second supply rail, and wherein the pre-amplifying stage comprises a first transistor and a second transistor arranged to be coupled in series between the first supply rail and the second supply rail, a node in between the transistors being coupled to an output of the voltage divider.

5. A protection circuit as claimed in claim 4, wherein the voltage divider comprises a diode chain.

6. A protection circuit as claimed in claim 4, wherein the first and second transistors are pMOS transistors.

7. A protection circuit as claimed in claim 4, wherein the control terminal of the second transistor is further coupled to the output of the voltage divider via a resistor.

8. A protection circuit as claimed in claim 7, wherein the control terminal of the second transistor is arranged to be coupled to the second supply rail via a further transistor, the further transistor being responsive to the sensor.

9. A protection circuit as claimed in claim 4, wherein the clamping circuit comprises a pair of transistors arranged to be connected in series between the first supply rail and the second supply rail.

10. A protection circuit as claimed in claim 9, wherein the pair of transistors of the clamping circuit includes:
    a first bipolar transistor having its collector arranged to be coupled to the first supply rail and its base coupled to the output of the voltage divider, and
    a second bipolar transistor being a second transistor of a Darlington stage, and a third bipolar transistor being the other transistor of the Darlington stage, and wherein the third bipolar transistor is responsive to the output of the pre-amplifying stage;
    and wherein the clamping circuit further comprises a further transistor arranged to be coupled between the first supply rail and the base of the first bipolar transistor, said further transistor being responsive to the detection signal.

11. A protection circuit as claimed in claim 9, wherein the pair of transistors of the clamping circuit includes:
    a first MOS transistor having its gate coupled to the output of the voltage divider; and
    a second MOS transistor being responsive to the output of the pre-amplifying stage;
    and wherein the clamping circuit further comprises a further transistor arranged to be coupled between the first supply rail and the gate of the first MOS transistor, the further transistor being responsive to the detection signal.

12. An integrated circuit comprising a first and second supply rails, and a protection circuit according to claim 1 coupled between the supply rails.

13. An electronic device comprising an integrated circuit as claimed in claim 12 and a power supply coupled to the first and second supply rails of the integrated circuit.

14. A protection circuit as claimed in claim 1, wherein the amplifier is a transistor.

15. A protection circuit as claimed in claim 1, wherein the amplifier is a MOS transistor.

16. A protection circuit for protecting an integrated circuit having a first supply rail and a second supply rail from exposure to an excessive voltage, comprising:
    a sensor for sensing a voltage increase on the first supply rail, the sensor having an output coupled to a signal path for providing a detection signal on said path;
    a clamping circuit for clamping the first supply rail to the second supply rail in response to the detection signal;
    a pre-amplifying stage having a control input coupled to the signal path and an output coupled to the clamping circuit; and
    a hold circuit for holding the control input of the pre-amplifying stage in an enabled state upon termination of the detection signal;
    a voltage divider for dividing the voltage across the first supply rail and the second supply rail; and
    wherein the pre-amplifying stage comprises a first transistor and a second transistor arranged to be coupled in series between the first supply rail and the second supply rail, a node in between the transistors being coupled to an output of the voltage divider;
    wherein the clamping circuit comprises a pair of transistors arranged to be connected in series between the first supply rail and the second supply rail;

wherein the pair of transistors of the clamping circuit includes:
a first bipolar transistor having its collector arranged to be coupled to the first supply rail and its base coupled to the output of the voltage divider, and
a second bipolar transistor being a second transistor of a Darlington stage, and a third bipolar transistor being the other transistor of the Darlington stage, and wherein the third bipolar transistor is responsive to the output of the pre-amplifying stage;
and wherein the clamping circuit further comprises a further transistor arranged to be coupled between the first supply rail and the base of the first bipolar transistor, said further transistor being responsive to the detection signal.

17. A protection circuit for protecting an integrated circuit having a first supply rail and a second supply rail from exposure to an excessive voltage, comprising:
a sensor for sensing a voltage increase on the first supply rail, the sensor having an output coupled to a signal path for providing a detection signal on said path;
a clamping circuit for clamping the first supply rail to the second supply rail in response to the detection signal;
a pre-amplifying stage having a control input coupled to the signal path and an output coupled to the clamping circuit; and
a hold circuit for holding the control input of the pre-amplifying stage in an enabled state upon termination of the detection signal;
a voltage divider for dividing the voltage across the first supply rail and the second supply rail; and
wherein the pre-amplifying stage comprises a first transistor and a second transistor arranged to be coupled in series between the first supply rail and the second supply rail, a node in between the transistors being coupled to an output of the voltage divider;
wherein the clamping circuit comprises a pair of transistors arranged to be connected in series between the first supply rail and the second supply rail;
wherein the pair of transistors of the clamping circuit includes:
a first MOS transistor having its gate coupled to the output of the voltage divider; and
a second MOS transistor being responsive to the output of the pre-amplifying stage;
and wherein the clamping circuit further comprises a further transistor arranged to be coupled between the first supply rail and the gate of the first MOS transistor, the further transistor being responsive to the detection signal.

* * * * *